United States Patent [19]

Delgado et al.

[11] Patent Number: 4,897,362
[45] Date of Patent: Jan. 30, 1990

[54] DOUBLE EPITAXIAL METHOD OF FABRICATING SEMICONDUCTOR DEVICES ON BONDED WAFERS

[75] Inventors: Jose A. Delgado, Satellite Beach; George Bajor, Melbourne, both of Fla.

[73] Assignee: Harris Corporation, Melbourne, Fla.

[21] Appl. No.: 92,975

[22] Filed: Sep. 2, 1987

[51] Int. Cl.⁴ .................... H01L 21/265; H01L 21/76
[52] U.S. Cl. ............................ 437/26; 148/DIG. 12; 148/DIG. 35; 148/DIG. 135; 148/33.4; 156/644; 156/662; 357/49; 437/31; 437/62; 437/67; 437/81; 437/86; 437/974
[58] Field of Search ............... 437/26, 30, 57, 62, 437/31, 64, 66, 67, 68, 81, 86, 233, 239, 954, 974, 980; 148/DIG. 10, 11, 12, 35, 38, 50, 118, 125, 135, 168, 33.1, 33.4; 156/610-615, 643, 644, 648, 653, 662; 357/49, 50

[56] References Cited

U.S. PATENT DOCUMENTS

| | | | |
|---|---|---|---|
| 3,508,980 | 4/1970 | Jackson, Jr. et al. | 437/86 |
| 3,876,480 | 4/1975 | Davidsohn | 437/774 |
| 4,104,086 | 8/1978 | Bondur et al. | 437/81 |
| 4,477,310 | 10/1984 | Park et al. | 156/648 |
| 4,554,728 | 11/1985 | Shepard | 437/67 |
| 4,631,803 | 12/1986 | Hunter et al. | 437/57 |
| 4,649,627 | 3/1987 | Abernathey et al. | 437/86 |
| 4,692,992 | 9/1987 | Hsu | 437/67 |
| 4,707,455 | 11/1987 | Tsang et al. | 437/63 |
| 4,707,456 | 11/1987 | Thomas et al. | 437/31 |
| 4,717,683 | 1/1988 | Parrillo et al. | 437/57 |

FOREIGN PATENT DOCUMENTS

| | | | |
|---|---|---|---|
| 0211263 | 12/1982 | Japan | 437/57 |
| 0066369 | 4/1983 | Japan | 437/86 |
| 0082530 | 5/1983 | Japan | 437/57 |
| 0048950 | 3/1984 | Japan | 437/974 |

Primary Examiner—Brian E. Hearn
Assistant Examiner—William Bunch
Attorney, Agent, or Firm—William A. Troner; Charles C. Krawczyk

[57] ABSTRACT

A method of forming a high-quality complementary transistor device using bonded wafer technology. The invention includes bonding a handle wafer to a first epitaxial layer and then providing dopants to form the respective N and P buried layers in said first epitaxial layer. A second epitaxial layer is then deposited over the buried layers to provide the device forming regions for the respective transistor devices.

13 Claims, 2 Drawing Sheets

DOUBLE EPITAXIAL METHOD OF FABRICATING SEMICONDUCTOR DEVICES ON BONDED WAFERS

FIELD OF THE INVENTION

The present invention relates generally to a method of producing semiconductor wafers, and more specifically to a method of forming complementary devices in bonded wafers.

BACKGROUND AND SUMMARY OF THE INVENTION

As is commonly known, the path between the collector-base PN junction and the collector contact in a monolithic bipolar circuit has a high series resistance. To reduce this resistance in general, a conductive buried layer is provided between the substrate and the epitaxial layer containing the collector. Although N+ buried layers are easily producible in vertical NPN devices, because of the high diffusion constant of P-type dopants, it is problematic to form P-type buried layers for vertical PNP devices. As a result, it is very difficult to manufacture complementary bipolar devices with both P and N-type buried layers.

One approach to fabricating complementary bipolar devices having an N+ buried layer is to use dielectric isolation (DI). In this process, anisotropically etched grooves are formed in a polished surface of N-type single crystalline silicon for separating later formed N and P type wells. P type dopants are then selectively diffused in the backside of the wafer to form the P type wells. Slow diffusion of N-type dopants such as arsenic is then selectively introduced in the N wells for forming the N+ buried layer.

In addition to the difficulty in producing a highly conductive P+ buried layer for the vertical PNP device, there are other disadvantages of the dielectric isolation process due to the high temperatures required for the process, as well as the mechanical grinding and polishing necessary to form the silicon wafer. Because the grinding and polishing steps have such a wide range of accuracy, this requirement of the process results in a wide tolerance of island thicknesses. With respect to the high temperatures of the DI process, stress can result in the islands, as well as warpage of the silicon wafer during the high temperature operations.

A more recent approach to producing dielectrically isolated bipolar devices uses bonded wafer technology. The present bonded wafer process includes the bonding together of one wafer having an epitaxial layer thereon with a second wafer having an oxide layer thereon. The first wafer is removed after bonding, leaving the epitaxial layer bound to the oxide surface, resulting in a basic SOI structure. Prior to the bonding, a buried layer can be formed by diffusing dopants into the epitaxial layer.

This bonding technique, while having the advantages of reducing wafer warpage and island stress, has the other disadvantages similar to the conventional DI. Because of the high temperature heating required during the bonding process, the diffusion time of the dopants is increased, particularly in the buried layer. This in turn reduces the sharpness of the doping profile at the first wafer and epitaxial layer interface, thereby reducing the accuracy of electrochemical/mechanical removal of the first wafer. Another disadvantage of the bonding process is that in order to align the buried layers which are diffused from the back side with the patterns of the front side, special alignment marks are required. These necessary marks may be formed by etching vias in the silicon and then filling the same with polycrystalline silicon. The formation of these marks adds to the difficulty in forming the bonded wafer structure, as well as provides potential unbonded sites.

It is therefore an object of the present invention to provide a new and improved complementary device in integrated circuits.

It is another object of the present invention to provide a new and improved bonded wafer fabrication process.

It is further an object of the present invention to provide a new and improved method for forming a buried layer in a bonded wafer.

It is still another object of the present invention to provide new and improved semiconductor devices having smaller dimensions and faster operating response.

These and other objects of the present invention are attained by providing a method of forming a semiconductor silicon on insulator (SOI) device which forms a buried layer after the actual bonding has been completed. In accordance with a preferred embodiment of the invention, a complementary bipolar SOI device is formed by initially forming a first epitaxial layer on a heavily doped substrate followed by bonding an oxidized handle wafer to the epitaxial layer. The original substrate is then ground, etched and polished away, resulting in a basic SOI structure. A conductive buried layer is then formed in the first epitaxial layer. In a preferred embodiment, this conductive layer may be formed by heavily diffusing N and P type dopants in designated N+ and P+ regions. A second epitaxial layer of N-type conductivity is then deposited over the N+ and P+ regions. The region over the P+ conductive region is then patterned and P type dopants are introduced from the front side of the wafer. This results in a light doped N region being formed over the N+ conductive buried region and light doped P region being formed over the P+ conductive buried region.

Since the conductive buried layers are formed after the bonding process, the heating during bonding will not effect the diffusion of the dopants in these layers. Thus, as a result of the invention, not only are P-type buried layers made possible, but the conductive buried layers will not tend to diffuse toward the surface. This reduction in up diffusion results in eliminating the need for the deeper tubs or wells of the conventional bonded wafers, thereby resulting in devices of smaller dimensions.

Also as a result of the invention, thinner islands can be produced. In the conventional dielectric isolation or bonded wafer technology, the thickness of the devices, e.g., the distance between the conductive buried layer and the collector-base junction, depends upon the grinding, etching and polishing technology. Therefore, the thickness tolerance is relatively large, which has a degrading effect on the performance of the devices. In accordance with present invention, the device is built entirely in a second epitaxial layer. As a result, the thickness of the device forming layer is dependent on the thickness of the second epitaxial layer which has a significantly better thickness tolerance than that associated with the conventional dielectric isolation process. Therefore, the present invention can produce much thinner islands and, consequently, smaller devices.

Additionally, because the diffusion is performed from the front side, alignment marks from the back side are not necessary. The diffused areas for the conductive buried layer actually provide noticeable unevenness on the surface as a result of the dopants being added. This unevenness is transferred to the second epitaxial layer, thereby providing noticeable aligning indicators for the subsequent doping of the second epitaxial layer. As a result of not requiring the alignment marks of the convention bonded wafer, the manufacturing of the bonded wafer is made easier and more reliable.

Further objects, features, and advantages of the present invention will become more apparent from the following description when taken with the accompanying drawings which show, for purposes of illustration only, an embodiment in accordance with the present invention.

BRIEF DESCRIPTIONS OF THE DRAWINGS

FIGS. 1-7 are enlarged cross-sectional views illustrating a sequence of steps in the fabrication of a semiconductor structure in accordance with a preferred embodiment of the invention.

DETAILED DESCRIPTION OF THE DRAWINGS

FIGS. 1-7 illustrate a bonded wafer process for producing complementary bipolar devices in accordance with a preferred embodiment of the present invention. It is noted, however, that the invention is not limited to bipolar technology. In this embodiment, a substrate 10 is formed of a monocrystalline silicon wafer of an N type conductivity having a resistivity of less than one hundredth of an ohm-cm. A first epitaxial layer 15 of monocrystalline silicon is grown using known methods and is usually N type doped with arsenic or antimony. The resistivity chosen for the epitaxial layer 15 is one to twenty ohm-cm, resulting in a large step-function profile at the interface of the substrate 10 and the first epitaxial layer 15. The epitaxial layer 15 deposition temperature should be as low as practical to limit diffusion and autodoping from the substrate 10. A temperature of approximately 1080° C. to 1100° C. is an appropriate temperature to provide quality crystal growth while maintaining diffusion and autodoping under control.

Figure 1:
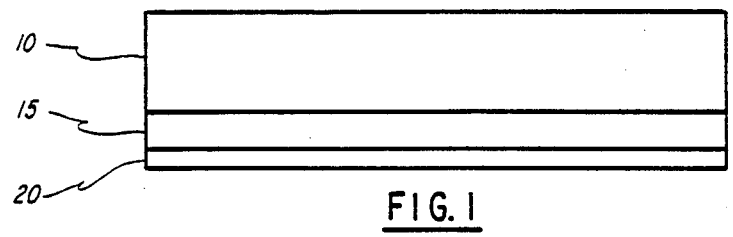

As illustrated in FIG. 1, the surface of the epitaxial layer is oxidized 20 to an optimum level to promote the oxide-to-oxide bond made later in this process. Typically this oxide layer 20 will be approximately 500 Angstroms thick. It is noted that native oxide which will grow on the exposed surface of the epitaxial layer may be sufficient to promote the oxide bonding, and thus a separate oxidation step for the epitaxial layer is not absolutely necessary.

Figure 2:
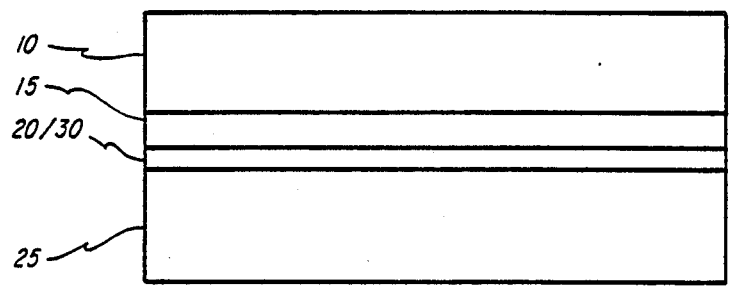

In FIG. 2, a wafer 25 is illustrated, commonly referred to as a handle wafer. This wafer 25 should have a flat, polished surface in addition to having a thickness variation of less than 5 microns with a typical thickness of approximately 500 to 600 microns. An oxide layer 30 is grown or deposited on the polished surface of the handle wafer 25 by any suitable technique, i.e. thermal oxidation in a temperature range of 850° C. to 1250° C. This oxide layer 30 will typically be between 1 to 3 microns thick.

The bonded wafer shown in FIG. 2 is formed by placing into contact the oxide layer 20 on the epitaxial layer 15 with the oxide layer 30 on the handle wafer 25. The two wafers are then placed in a furnace at approximately 1100° C. for approximately one hour or more. The furnace may include an oxidizing ambient such as steam or wet oxygen to help facilitate the bonding process. The bonding occurs, reportedly, due to the fusing of the hydroxyl groups in the two oxidized surfaces.

Alternatively, the two wafers may be bonded by placing them in a rapid thermal annealer (RTA) which is capable of heating the wafers up to 1200° C. in 30 seconds or less. After the wafers are placed in the RTA, they are rapidly heated to a temperature between approximately three to ten minutes. Prior to the heating of the wafers, the RTA may be purged of contaminants by a gas such as oxygen.

Figure 3:
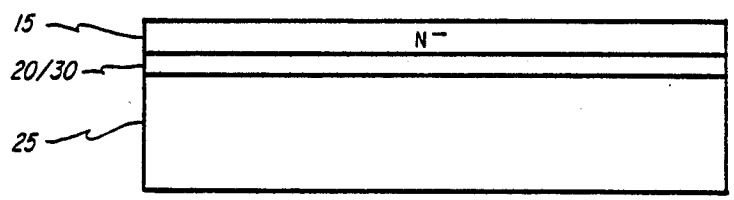

Referring to FIG. 3, the original wafer substrate 10 is now ground and etched away in a fashion similar to that described in a commonly assigned U.S. Pat. No. 4,554,059 to Short et al, entitled "Electrochemical Dielectric Isolation Technique" and which disclosure is herein incorporated by reference. Briefly, this etching process including thinning the substrate 10 by grinding or etching to usually between 1 to 2 mils thick. The remainder of the substrate is electrochemically etched to near the original interface between the heavily doped substrate 10 and the lightly doped epitaxial layer 15. This is generally done in a dilute hydroflouric (HF) bath with electric current flowing through the conductive substrate layer 10. The thin layer remaining from the surface is then chemically polished away to remove any reaction products due to the electrochemical process in addition to removing any heavier doped region due to diffusion or autodoping. It is significant to keep the time-temperature conditions of the epitaxial layer 15 and substrate 10 interface as low as possible in order to minimize the amount that has to be removed. The present invention significantly reduces the time-temperature conditions as compared to the prior bonding techniques.

Figure 4:
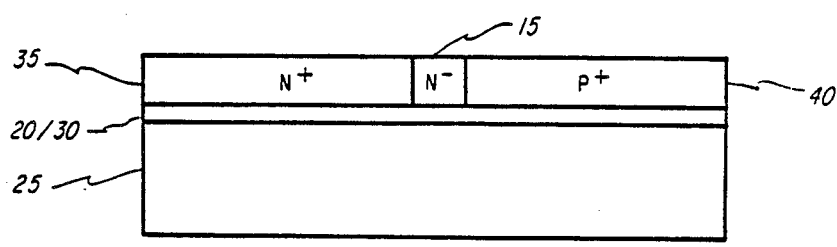

A photoresist masking layer (not shown) is now applied to the first epitaxial surface such that a region designated for the N+ buried layer 35 is exposed. N-type dopants such as arsenic or phosphorus are heavily diffused into this region, thereby forming the buried layer 35 for a later formed NPN transistor. This diffusion by way of example may be $R_S \leq 100$ ohms per square. A new photoresist masking layer (not shown) is then applied to the surface of the first epitaxial such that a region designated for the P+ buried layer 40 is exposed. P-type dopants such as boron are heavily diffused into this region, thereby forming the P+ buried layer 40 for a later developed PNP transistor, as shown in FIG. 4. This diffusion by way of example may be $R_S \leq 100$ ohms per square. Alternatively, ion implantation can be used in place of diffusing the respective dopants, for forming the N+ and P+ regions.

Figure 5:
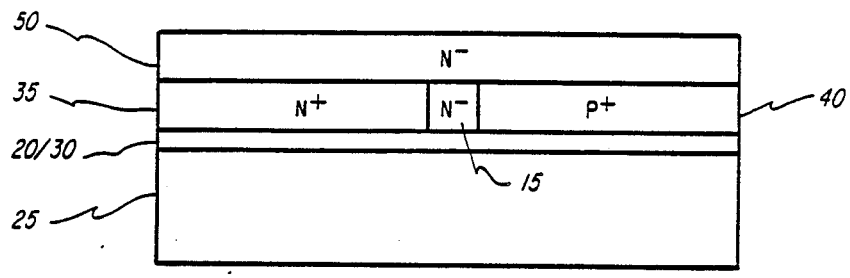

A second epitaxial layer 50 is now deposited over N+ and P+ regions, as shown in FIG. 5. This epitaxial layer 50 is grown using known methods and can be N type doped with antimony, arsenic or phosphorus. The resistivity chosen for this second layer of epitaxial material can range between 0.1 ohm-cm and 1.0 ohm-cm. As with the first epitaxial layer, the deposition temperature should be as low as practical to limit the diffusion of the dopants in the buried layer. This epitaxial layer 50 thickness also depends upon the current application of the semiconductor device and can be within approximately $2\mu$ and $10\mu$.

One method for doping the second epitaxial layer 50 is to form the second layer with N-type conductivity.

The P-type dopants are then selectively introduced by diffusion or implant over the P+ buried layer region. An alternative method is to form a light doped N-type epitaxial layer 50. The N and P device regions are then selectively introduced to form the device forming regions above the respective buried layers. The concentration of dopants is dependent upon the subsequent device requirements.

Figure 6:
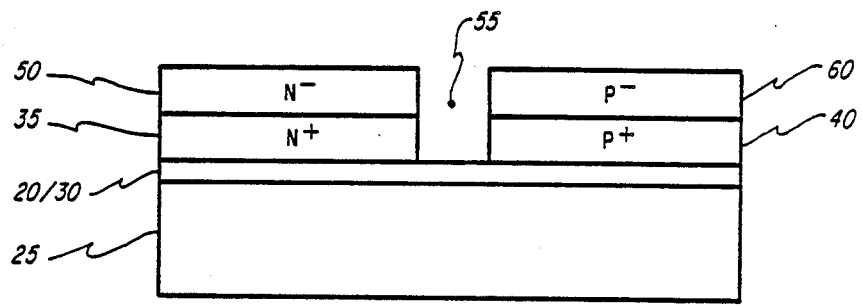
Figure 7:
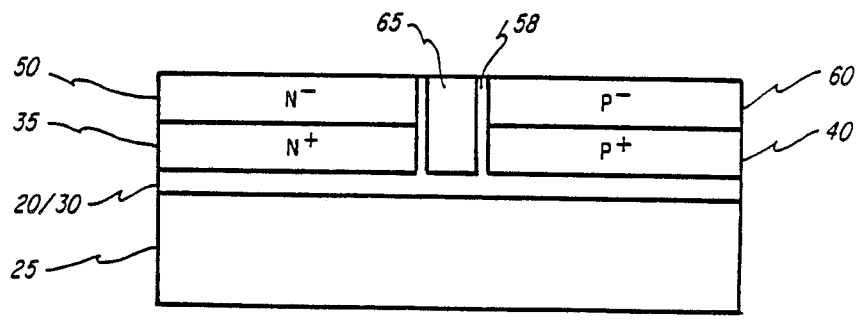

To separate the N+ 35 and the P+ 40 buried regions, and the N− 50 and the P− 60 device regions, a trench 55 is formed by selective reactive ion etching to the insulating material as shown in FIG. 6. The sidewalls of the trenches are then coated by an insulating film 58 such as silicon dioxide and/or silicon nitride using common techniques of thermal oxidation or chemical vapor deposition. In a preferred practice, the insulating film is silicon dioxide thermally grown at 1100° C. to a thickness of one micron. Additional filling material such as polycrystalline silicon is then provided for filling up the trench 55 followed by a planarization step. The polycrystalline silicon 65 can be deposited by chemical vapor deposition using $SiH_4$ at a temperature of 630° C. The thickness of the polycrystalline silicon is approximately 20% larger than the width of the trench 55. The polycrystalline silicon layer is then planarized by etching away the layer from the surface of the second epitaxial layer by plasma etching or reactive ion etching, leaving the polycrystalline layer only in the trench 55. The required doping for the device regions above the N+ and P+ buried layers will then be formed by selective diffusion of the appropriate dopants from the front side, and by up diffusion of the buried layers, as illustrated in FIG. 7. Subsequent processing is implemented to form the complete NPN and PNP transistors.

Although the invention improves complementary bipolar devices because of the improvement in the formation of the buried layers, other types of transistor devices such as JFETs can be easily implemented whereby the conductive buried layers can serve as the bottom gates. It is also noted that while the above discussion of the invention is focused on fabricating complementary devices, the invention and its advantages apply equally well to fabricating noncomplementary transistors.

As a result of the invention, complementary transistor devices can be formed with conductive buried layers in bonded wafers. This provides the benefits of bonded wafer technology, such as less warpage and stress in the islands as well as complete isolation surrounding the wells. The invention also significantly reduces the disadvantage of bonded wafers by significantly reducing the time-temperature diffusion of dopants in the buried layer which previously occurred during the bonding process. Also as a result of the invention, back side alignment markings are no longer required, thereby avoiding the difficulty in fabricating such marks, as well as the potential problems of bonding with the marks included.

Another advantage of the invention is that the active layer thickness which affects the performance of the devices will not depend on the grinding/etching/polishing tolerance. This thereby allows for the producibility of very shallow devices for high speed operation.

Although the present invention has been described and illustrated in detail, it is to be clearly understood that the same is by way of illustration and example only, and is not to be taken by way of limitation. The spirit and scope of the present invention are to be limited only by the terms of the appended claims.

We claim:

1. A method of manufacturing a semiconductor wafer comprising the steps of:
   (a) providing a first layer of semiconductor material formed on a first support structure;
   (b) providing a second layer of insulating material formed on a handle wafer;
   (c) bonding said first layer of semiconductor material to said second layer of insulating material;
   (d) removing said support structure from said first layer of semiconductor material and exposing a first surface of said first layer;
   (e) selectively providing a conductive layer in said first layer of semiconductor material subsequent to removing said support structure, said conductive layer having an exposed top surface; and
   (f) providing a second layer of semiconductor material on said exposed surface of said conductive layer.

2. The method of claim 1, wherein said first layer of semiconductor material is formed by epitaxial growth on said support structure, said second layer of semiconductor material is formed by epitaxial growth on said conductive layer.

3. The method of claim 2, wherein said conductive layer is formed by selectively introducing dopants of a first conductivity type into said first epitaxial layer.

4. The method of claim 2, wherein said conductive layer comprises first and second conductive regions, said first conductive region is formed by selectively introducing dopants of a first conductivity type into said first conductive region and said second conductive region is formed by selectively introducing dopants of a second conductivity type into said second conductive region, said first and second conductive regions providing respective buried layers for the second epitaxial layer.

5. The method of claim 4, further comprising forming a trench between said first and second conductive regions, wherein said trench is lined with an insulating material for isolating said first and second conductive regions from each other and wherein said lined trench is filled with a filling material.

6. The method of claim 5, further comprising providing a third layer of insulating material on said first layer of semiconductor material prior to bonding with said second layer of insulating material on said handle wafer.

7. The method of claim 6, wherein said bonding includes the steps of bringing said layer of insulating material on said handle wafer into contact with said insulating layer on said first layer of semiconductor material and heating the same to a temperature of between approximately 800° C. and approximately 1200° C.

8. A method of manufacturing a semiconductor wafer comprising:
   (a) providing a first epitaxial layer formed on a substrate material;
   (b) providing a first insulating layer formed on a handle wafer;
   (c) bonding said first epitaxial layer to said first insulating layer;
   (d) removing said substrate material from said first epitaxial layer and exposing a surface of said epitaxial layer;
   (e) selectively forming a conductive buried layer in said first epitaxial layer subsequent to removing said substrate material, said conductive buried layer having an exposed top surface; and (f) providing a second epitaxial layer formed on said exposed surface of said conductive buried layer.

9. The method of claim 8, wherein said conductive buried layer includes a first and a second conductive region, said first conductive region is formed by selectively diffusing dopants of a first conductivity type and second conductive region is formed by selectively diffusing dopants of a second conductivity type, said first and second conductive regions providing respective conductive buried layers for said second epitaxial layer.

10. The method of claim 9, wherein said second epitaxial layer includes a first and second region, wherein said first region is formed by lightly doping said first region with dopants of said first conductivity type, said first region being formed over said first conductive region, wherein said second region is formed by lightly doping said second region with dopants of said second conductivity type, said second region being formed over said second conductive region.

11. The method of claim 10, further comprising forming a trench between said first and second conductive regions, wherein said trench is lined with an insulating material for isolating said first regions in said first and second epitaxial layers from said second regions in said first and second epitaxial layers, and further filling said lined trench with a filling material.

12. The method of claim 11, further comprising forming a second insulating layer over said first epitaxial layer prior to bonding such that said bonding is between said first and said second insulating layers.

13. The method of claim 12, wherein said first and second insulating layers include an oxide.

* * * * *